United States Patent
DeFlumere

(10) Patent No.: US 7,485,860 B2
(45) Date of Patent: Feb. 3, 2009

(54) THERMOELECTRIC BRIDGE IR DETECTOR

(75) Inventor: Michael DeFlumere, Winchester, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 10/400,261

(22) Filed: Mar. 28, 2003

(65) Prior Publication Data
US 2004/0188615 A1 Sep. 30, 2004

(51) Int. Cl.
G01J 5/00 (2006.01)
(52) U.S. Cl. .................................................. 250/338.1
(58) Field of Classification Search ............... 250/338.1; 62/3.7
See application file for complete search history.

(56) References Cited

U.S. PATENT DOCUMENTS

| | | | |
|---|---|---|---|
| 4,166,390 A * | 9/1979 | Benzinger | 136/213 |
| 6,144,030 A | 11/2000 | Ray et al. | |
| 6,230,497 B1 * | 5/2001 | Morris et al. | 62/3.7 |
| 6,323,486 B1 * | 11/2001 | Grossman et al. | 250/338.1 |
| 6,489,615 B2 * | 12/2002 | Bluzer | 250/338.1 |
| 2003/0025174 A1 * | 2/2003 | Lubomirsky et al. | 257/461 |
| 2003/0057371 A1 * | 3/2003 | Wood | 250/330 |

* cited by examiner

Primary Examiner—David P Porta
Assistant Examiner—Shun Lee
(74) Attorney, Agent, or Firm—Robert K. Tendler

(57) ABSTRACT

An IR detector for use in an array of detectors is provided with better thermal resolution resulting in increased range and increased contrast for a standard 30 frame per second frame rate includes a support structure for the detector made from thermoelectric material supports which transports heat away from the detecting material during each readout cycle just after the instantaneous reading has been made. By removing heat thermoelectrically from the detector, detector sensitivity is improved, higher frame rates are achievable and an improved fill factor is the result of being able to more closely pack the detector elements.

3 Claims, 5 Drawing Sheets fill factor % ⇒ 90%

THERMOELECTRIC BRIDGE IR DETECTOR

FIELD OF INVENTION

This invention relates to microbolometers more particularly to the utilization of a thermoelectric bridge to cool the detector during readout to increase sensitivity and increase frame rates.

BACKGROUND OF THE INVENTION

In focal plane arrays, current microbolometer uncooled technology is based on micro-machined structures that support a thermally sensitive material which involves a change in resistance in material based on incoming infrared radiation. When an array of such detectors is utilized, each of the individual detector elements is thermally isolated from its base or substrate through the utilization of relatively thin conductors, two per detector, which go from contact pads on the detector and snake about to contact pads on the substrate. The purpose of this type of mounting system is to provide a low thermal conductivity mounting device. The reason for the low thermal conductivity is to increase sensitivity. This means that all of the incident energy is converted to a signal and is not leaked out by virtue of heat exiting through the mounting apparatus.

During the detector readout procedure a current probes the resistive element and the change in resistance over an initialized value is read out. However, passing electricity or current pulse through the detector to be able to readout the change in resistance heats the detector.

Note that the voltage corresponding to the incident IR radiation is read out during the current pulse. After the readout, the current is removed and the temperature increase dissipates back to an equilibrium temperature. As will be appreciated, one must let the detector cool down between cycles which means to promote rapid cooling one needs a good thermal conductor for the mounting device for the detector. By rapidly cooling one could achieve a high frame rate.

However, using a high thermal conductivity mounting device severely reduces sensitivity. There is therefore a need for some type of mounting device that will not affect good sensitivity, yet permit high frame rate readouts.

The high frame rate is a requirement for heat seeking missiles in which there are high dynamics in the scene. In order to be able to track rapidly moving images one needs a frame rate in excess of 200 frames per second. However, because of the need for low thermal coefficient mounting devices for sensitivity, the cool down of the detector after a readout pulse is much too slow for such an application.

Moreover, other circuit elements in the IR detection system throw off heat and it is for this reason that it is desirable to thermally isolate the detector from its substrate as much as possible. This as well as sensitivity is the reason for the utilization of the thin electrical conductors which do not result in a significant amount of heat being transmitted from the substrate to the detector or vice versa.

There is however a further problem with the thin serpentine electrical conductors. The use of these thin electrical conductors in a looped or serpentine structure in which the detector in essence sits unanchored to the substrate but for the conductors takes a considerable amount of real estate. This in turn deleteriously affects the fill factor of an array of such a detectors such that the area for the detectors may be as low as 60% of the overall area. Detectors spaced apart in this position lower the overall resolution of the array, it is therefore important to be able to have a detector mounting system that thermally isolates the detector from the substrate while at the same time occupying virtually no additional space in the lateral direction.

One U.S. Patent which attempts to provide for a small pixel high fill factor uncooled focal point array is that which is described in U.S. Pat. No. 6,144,030. In this patent a thermal isolation structure is utilized to mount the detectors to a substrate. The thermal isolation structure is coupled to and spaced from the sensor which involves connection to the optically absorptive material structure. In this patent it is said that the thermal isolation structure facilitates very high fill factors even when the pixel size is shrunk below the base line 50-micron size.

In essence what this patent shows is a serpentine structure underneath the photodetector which provides the same type of thermal isolation as the serpentine conductors discussed above which are to either side of the detector. However, the thermal isolation structure while addressing fill factor fails to address the requirements of high frame rates or sensitivity.

It will be appreciated that the ideal thermal detector would have a 100% conversion of thermal energy to an observable resistance or capacitance change or the generation of a voltage potential. In order to do so it is important that the detector be thermally isolated so that all the received thermal energy is converted. It is also desirable to have the detector quickly return to an equilibrium temperature after the termination of the readout pulse. These two requirements are in opposition.

Note that for microbolometers the conversion efficiency is only in the 2 to 4% range, making thermal isolation extremely important.

To achieve increased sensitivity, low thermal conductivity supports are used to hold the detecting material. How low this can go is a problem if one wants high frame rates. In operation, after a period of integration the resistance change is determined by applying a bias voltage and measuring the resulting current or by applying a pulse of current and detecting voltage. This adds heat to the detector that must be dissipated within a short period of time for a high frame rate. For TV video frame rates at 60 Hertz, (e.g., 30 frames per second) this means that the device must settle in 16 milliseconds, e.g., the device must have a time constant of about 5 milliseconds. This requirement places a lower limit on the thermal conductivity of the support structure, and thus negatively impacts sensitivity.

SUMMARY OF THE INVENTION

In the subject invention a thermoelectric bridge structure supports the detector and is used both to readout the detector as well as cool it during the readout cycle. The thermoelectric bridge structure is an exceptionally good thermal insulator when current is not applied to it. Such a thermoelectric bridge thus thermally isolates the detector to improve sensitivity. Moreover, during readout, the thermoelectric bridge removes energy generated during the readout process. This permits increased frame rates due to the cooling. The use of the thermoelectric bridge thus solves the conflict of demands on the support structure for the detectors.

Put another way, present day microbolometers have conflicting design requirements. Seekers and other high performance imaging systems require high thermal sensitivity (low NE$\Delta$T), high frame rate and good spatial resolution. These conflicts can be seen by looking at the relationship of defining parameters for a microbolometer.

The limit for the frame rate is governed by the thermal time constant $\tau_T = C/G$ where C is the heat capacity of a pixel and G is the thermal conductance of a pixel. The sensitivity, as defined by NEΔT, is proportional to 1/R where R is the responsivity of the detector. However, R is proportional to 1/G which means NEΔT is proportional to G. This produces a conflict and results in a compromised design. High sensitivity requires G to be low, but high frame rate requires G to be high.

The thermoelectric bridge IR detector solves this dilemma by having a low G during the imaging time for low NEΔT (high sensitivity) and a high G during the readout time enabling high frame rate.

High resolution systems require that the pixels be made as small as possible for two reasons. Small pixels will reduce the size of the optical system for a given resolution and reduces the physical size of the array to improve production yield. The sensitivity is also proportional to $1/A_D$ where $A_D$ is the area of a pixel. Here again there is a conflict in the size of the pixel. The thermoelectric bridge IR detector approach allows the pixels to be reduced while maintaining sensitivity. This is accomplished using two techniques enabled by this approach. First, the fill factor can remain high since the supporting structure is under the pixel. Second, the sensitivity can be improved by using a higher resistivity pixel element. Higher resistivity pixel elements are precluded in present technology due to the high joule heating ($I^2 R$) and its effect on thermal time constant.

More particularly, in the subject invention a high efficiency thermoelectric bridge is used to support the detector, with the material in one embodiment being bismuth telluride that has the highest thermoelectric figure of merit or measure of efficiency. Utilizing two support legs, the bias current that is used to readout the detector is at the same time used to cool the detector, with the cooling derived from the thermoelectric effect. This allows the decoupling of conductivity of the support with its thermal time constant. If the heat flow out, i.e., cooling, is matched to the heat deposited, then the devices can operate at very high frame rates for instance at hundreds to thousands of frames per second.

In short, the heat generated during the readout of the detector is removed immediately after the instantaneous readout of the detector such that the detector is returned to an equilibrium thermal state very quickly. This means that the frame rates at which the array may be operated are indeed increased to well beyond 60 Hertz, effectively well beyond a 30 frame per second frame rate.

What one has done by thermally isolating the detector and nullifying the heat generated by the readout process is that the sensitivity of the array dramatically increased. This is because the thermal conductivity of the detector support is returned to its low conductivity condition with the removal of current between readout pulses. This isolates the detector for most of the integration of incoming IR radiation.

When the readout current is applied to the bridge the detector is cooled due to the thermoelectric effect. This means that any temperature build up due to readout current is cancelled. The net result is that for a standard frame rate of 30 frames per second, the range of the array may be increased by a factor of three. Put another way, there is an increase in contrast of the pixels corresponding to the detectors in the array. Either way, sensitivity is dramatically increased.

Also, by utilizing the thermoelectric bridge support for each of the detectors, the detectors may be closely spaced together, since the readout apparatus is not between the detectors but rather underneath them. The result is a fill factor exceeding 90% which results in a dramatic increase in resolution for the array.

The subject thermoelectric bridge support for uncooled focal point arrays has application in a number of situations. The first application use is in tactical missile seekers. In these seekers one needs to drive the NEΔT or sensitivity to new heights, translating into increased range, while at the same time dramatically increasing the frame rate. The objective of utilizing such a thermoelectric bridge support structure is to improve the NEΔT to less than 10 mK. It is also important to be able to increase the fill factor to 90% and to increase the frame rate to over 100 Hertz.

Focal point arrays constructed in accordance with the subject invention have application in precision attack missiles, common missiles such as hell-fire missiles, low cost precision kill devices and guided sub-munitions. Also included in the types of applications for the subject focal point array are missile defense seekers.

Being able to increase both the sensitivity and the resolution of an IR focal point array is also important in commercial and public safety arenas, for instance, for fire fighting. It is oftentimes necessary to penetrate dense smoke in order to detect the presence of an individual, and adequate resolution is critical for this purpose. The higher sensitivity of the subject focal plane arrays makes them ideal for this purpose. Of course, battlefield smoke is always a problem and the utilization of such a focal point array having sufficient resolution is critical to battlefield scenarios.

Equally as important is the frame rate. In missile seekers, the change in the IR image is quite significant due to the relative speed of the missile with respect to an intended target. It is important to be able to detect the target at high frame rates, thus to be able to minimize the effect of frame rate on target acquisition.

The key benefits of the thermoelectric bridge support is first and foremost low thermal conductance of a pixel G and improved NEΔT. Also important is the decoupling of G and time constant. This eliminates frame rate limitations due to the readout integrated circuit, ROIC, and available power. A third benefit is the improved fill factor noted above, whereas the fourth key benefit is the improvement over bulk properties of materials used to mount the detector. One expects a four times improvement which will allow one thermoelectric module, i.e., an N and P device, to balance heat up to 0.85 volts of bias.

Note that by utilizing bismuth telluride, one can quickly bring the detector back to an equilibrium temperature due to the exceptional thermal efficiency of bismuth telluride.

Importantly, with the ability to increase the frame rate from 60 Hertz to 200 Hertz, and doing so without compromising sensitivity is indeed a breakthrough.

When the subject focal point array is used as an IR camera, the camera converts the long wave infrared LWIR from the scene into a digital video stream that is forwarded to a target acquisition unit. The camera views the scene through a lens in a protective dome in one embodiment, with the camera containing the subject focal point array to sense the IR signal. The lens focuses the IR image onto the focal point array and maps the required scene field of view to the focal point array geometry. The focal point array constitutes an uncooled microbolometer and readout integrated circuit that converts the IR signal to a 320×240 digital image at a 200 Hertz, or better, rate.

Utilizing the subject focal point array, applications include thermography, weapon stations, helmet sights, unattended sensors, surveillance, weapon sights, fire fighting, and use on a wide variety of infantry carrier vehicles.

In summary, an IR detector for use in an array of detectors is provided with better thermal sensitivity resulting in increased range and increased contrast by utilizing a support structure for the detector made from thermoelectric material supports which thermally isolates the detectors between readout pulses and then transports heat away from the detecting material during each readout pulse just after taking a reading. By removing heat thermoelectrically from the detector, detector sensitivity is improved, higher frame rates are achievable and an improved fill factor results.

BRIEF DESCRIPTION OF THE DRAWINGS

These and other features of the subject invention will be better understood in connection with the Detailed Description in conjunction with the Drawings, of which.

DETAILED DESCRIPTION

Figure 1:
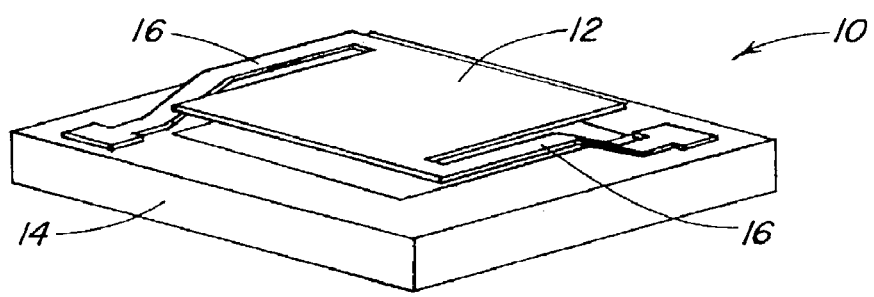
FIG. 1 is a diagrammatic illustration of an IR detector for use in a focal plane array showing the detector electrically coupled to a read out integrated circuit through the use of serpentine conductors.
Figure 2:
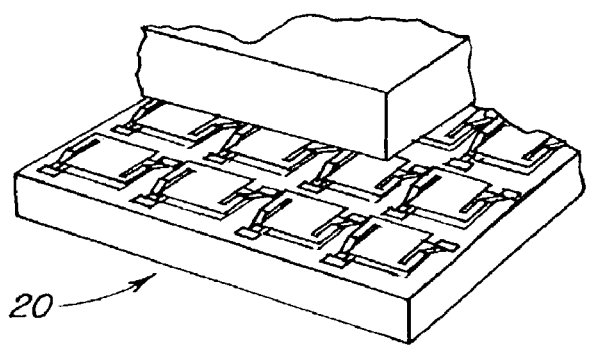
FIG. 2 is a diagrammatic illustration of a portion of a focal plane array composed of the detectors of FIG. 1.

Referring now to FIG. 1, a detector element 10 of an IR focal plane array mounted to a readout integrated circuit 14 through the use of thin serpentine electrical conductors 16 which serve to thermally isolate detector 12 from substrate 14. An array of 20 of such detectors is illustrated in FIG. 2 which shows that the individual detectors are arranged side by side.

Figure 3:
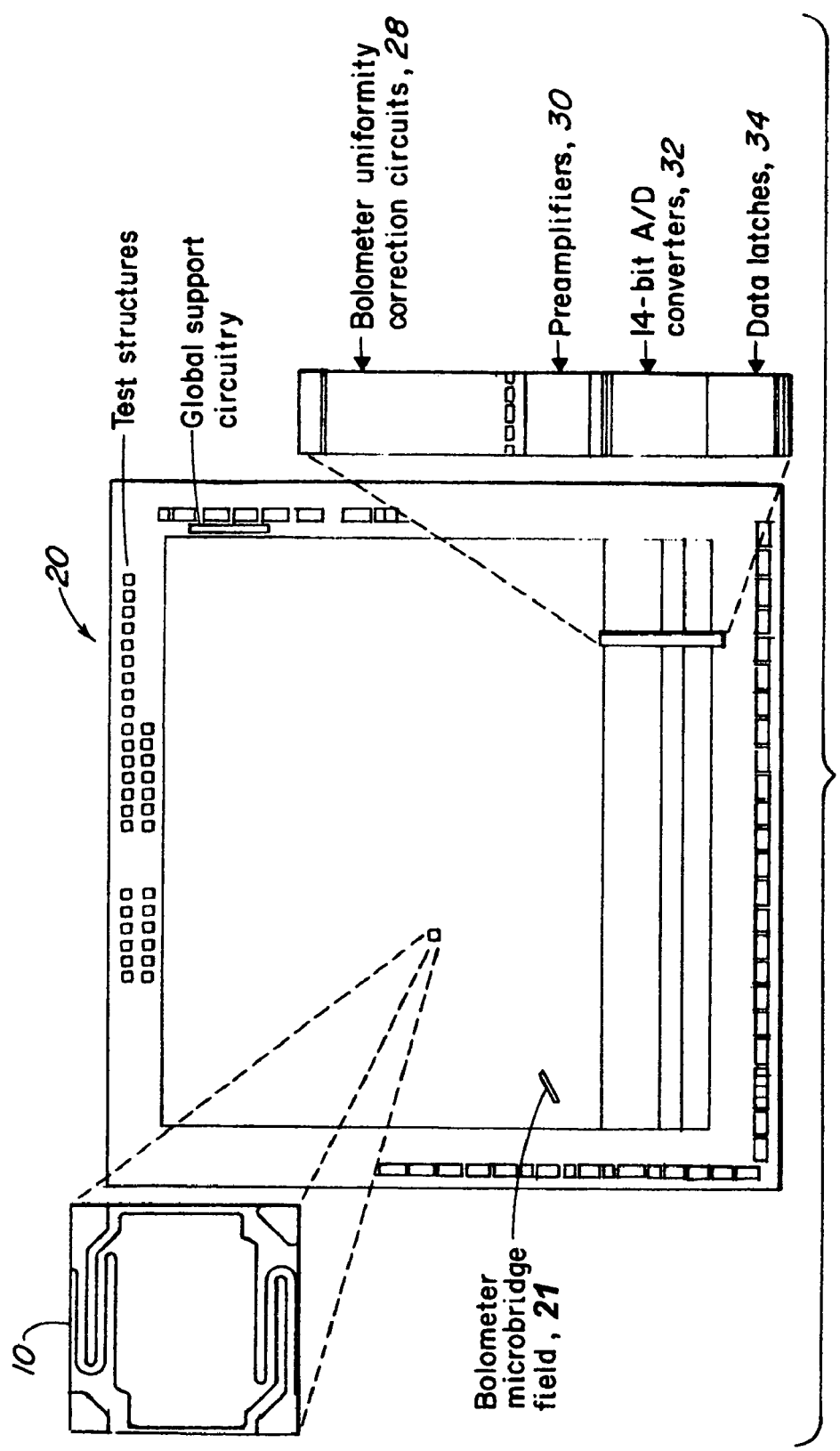
FIG. 3 is a diagrammatic illustration of a complete focal plane array utilizing bolometer detectors showing an exploded view of one of the detectors as well as portions of the array including a bolometer uniformity correction circuit block, preampliers, a 14 bit A/D converter and data latches.

Referring to FIG. 3, the entire array 20 is illustrated with an inset of an individual detector 10 being illustrated. Here it can be seen that the array constitutes a bolometer microbridge field 21, in one embodiment a 320×240 array.

Figure 4:
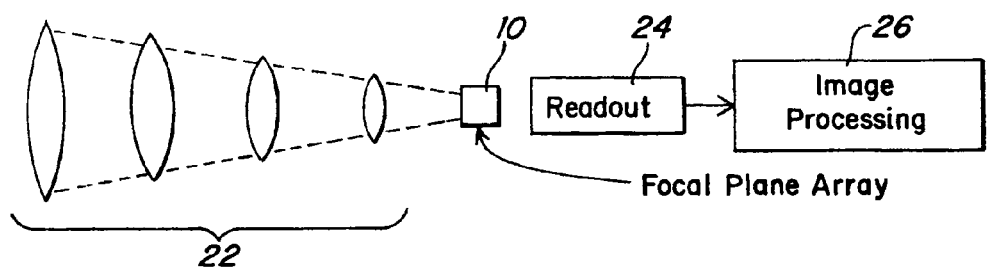
FIG. 4 is a block diagram illustrating the utilization of a focal plane array positioned between an array of lenses and a read out integrated circuit.

Referring to FIG. 4, incident infrared radiation is imaged onto detector 10 through imaging lenses 22, with the each detector being readout by a read out integrated circuit 24 the output of which is coupled to image processing 26. Included in the read out are the bolometer uniformity correction circuits 28, preampifiers 30, 14 bit analog-to-digital convertors 32, and data latches 34.

Figure 5:
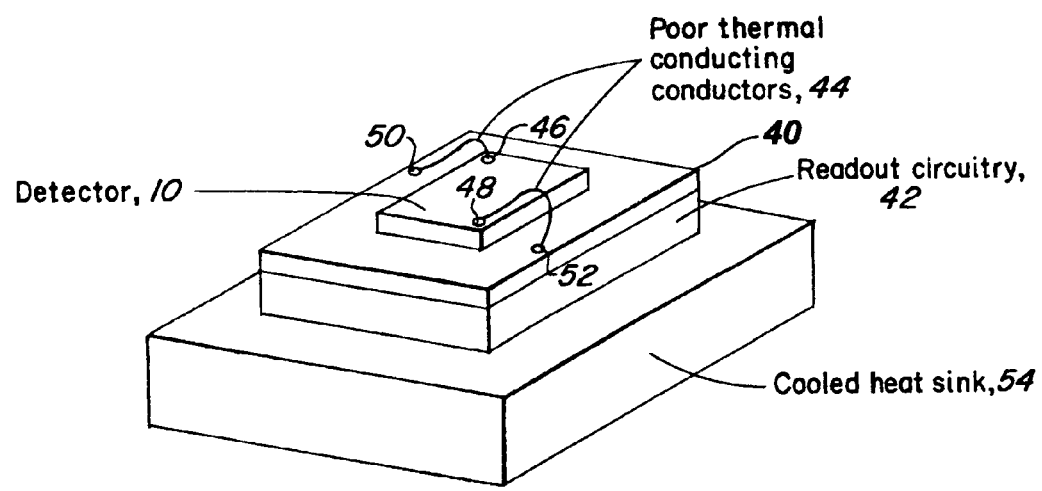
FIG. 5 is a diagrammatic illustration of one of the detectors, illustrating the utilization of a thermoelectric stabilizer as part of the heat sink on which is mounted a read out integrated, circuit on top which is a mounted an IR detector.

As illustrated in FIG. 5, detector 10 is schematically shown atop a substrate 40 which lies atop a readout integrated circuit 42. The purpose of the read out integrated circuit is to probe detector 10 with current pulses to read out the change in voltage due to incident infrared radiation. In order that the sensitivity of the detector be maximized, it is required that the detector be attached to substrate 40 through the use of poor thermal conductivity conductors or wires 44 that are attached at two points 46 and 48 to the detector. The aforementioned probing current is then applied across the resistive element of the detector by application of the current across these two points. The two points include pads on the detector itself, which are in turn coupled by conductors 44 to respective pads 50 and 52 on substrate 40. The poor thermal conductivity of these conductors is required for two reasons. The first is so that whatever IR energy is incident on the detector is not corrupted by the temperature of substrate 40. These two poor thermal conductivity conductors thermally isolate detector 10 from substrate 40 and the remainder of the circuits.

As will be discussed, probing the detector with a current results in heating of the resistive element. It is therefore important that any heat which is built up at detector 10 not be transmitted to substrate 40. Likewise it is important that any heat generated by the remainder of the circuits not be transmitted to detector 10. In order to do this a cool heat sink 54 which is thermoelectrically stabilized to be at 30-40° C. is utilized to make detector 10 thermally independent of its surrounding.

Figure 6:
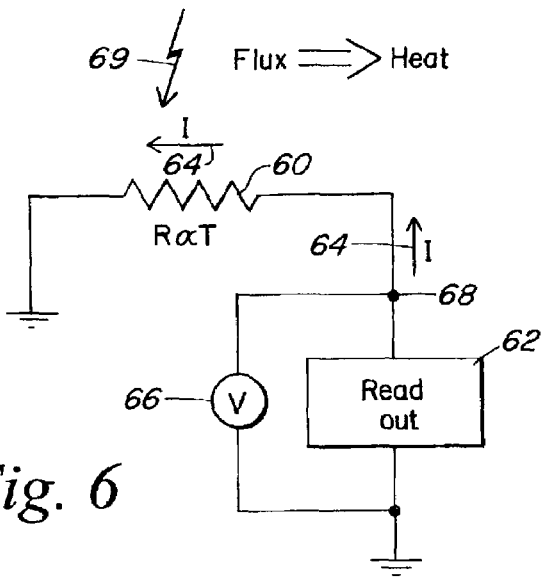
FIG. 6 is a schematic diagram of the read out of the IR detector of FIG. 1, illustrating the utilization of a current pulse to read out a resistance element.

Referring now to FIG. 6, a resistive element 60 in detector 10 is coupled to readout circuit 62 which generates a current, I, that moves through resistive element 60 as illustrated by arrows 64. The voltage established at 66 between conductor 68 and ground measures the change in resistance of resistive element 60 due to incoming radiation or flux 69.

It will be appreciated that incident infrared radiation or flux heats up resistive element 60 as does the probing current used in its readout. Thus when one has a probing current one generates heat.

In order to readout the resistive element, one induces current through application of a 50 microsecond current pulse and then one reads out the voltage during the first portion of the current pulse. Thereafter, one removes the current, at which time that it is important that the temperature increase generated by the readout pulse be dissipated as rapidly as possible to bring the detector back to equilibrium. The readout and cool down is done during the 50 microsecond current pulse. Note that the temperature which must be dissipated is a result of the current plus the incident flux.

It will be appreciated that one has to wait until the detector is cooled down between cycles and therefore one needs a good thermoconductor to remove this heat in order to achieve a high frame rate. Thus is done during the readout pulse which cools the thermoelectric bridge.

If the detector is to be read out at 30 frames per second corresponding to 60 Hertz, the duty cycle is 16.6 milliseconds long, and it is during this integration time that the incoming IR flux is built up at the detector.

As mentioned hereinbefore, utilizing a high thermoconductivity support for the detector while permitting higher frame rates dramatically reduces sensitivity.

Figure 7:
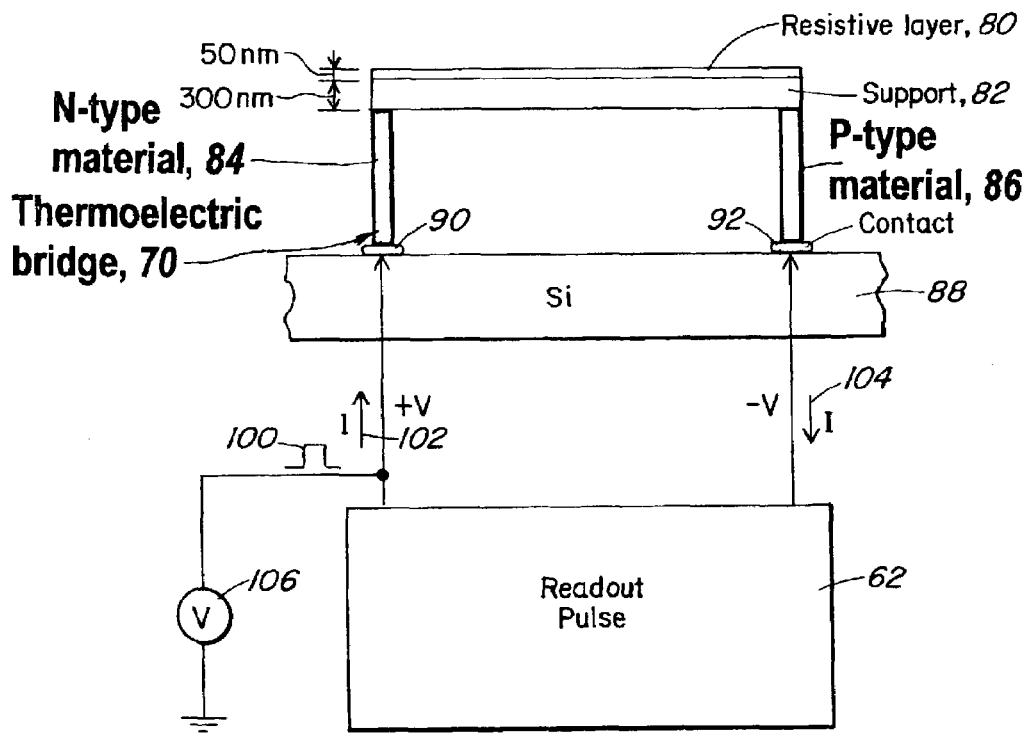
FIG. 7 is a diagrammatic illustration of the subject thermoelectric bridge structure in which a resistance layer is supported by two legs of opposite conductivity type such that when a read out pulse is applied to the resistive layer through the semiconductor legs, the read current develops voltages indicating the intensity of incident infrared radiation, while at the same time providing that the legs are cooled by the current due to the thermoelectric effect.

Referring now to FIG. 7, in order to provide a high sensitivity detector while at the same time providing for a high frame rate, in the subject invention a thermoelectric bridge 70 supports a detector comprised of a resistive layer 80 on a support 82 which is an turn supported by semiconductive legs 84 and 86 of opposite conductivity type. In a preferred embodiment these legs are made of bismuth telluride and are doped respectively to be an N-type material and a P-type material. In one embodiment, the resistive layer 80 is 50 nanometers in thickness and the support is approximately 300 nanometers in thickness.

Legs 84 and 86 are connected to a silicon substrate 88 at conductive pads 90 and 92 as illustrated.

The readout pulse is generated at readout unit 62 which includes a pulse 100, the current of which goes upwardly as illustrated by arrow 102, through N-type leg 84 through resistive layer 80 and down through P-type leg 86 as illustrated by arrow 104. With current in this direction, the legs are cooled. This extracts heat from the resistive layer and support layer.

At the same time voltage measured at 106 provides an instantaneous readout of the flux incident on resistive layer 80 with the beginning of the current pulse.

Figure 8:
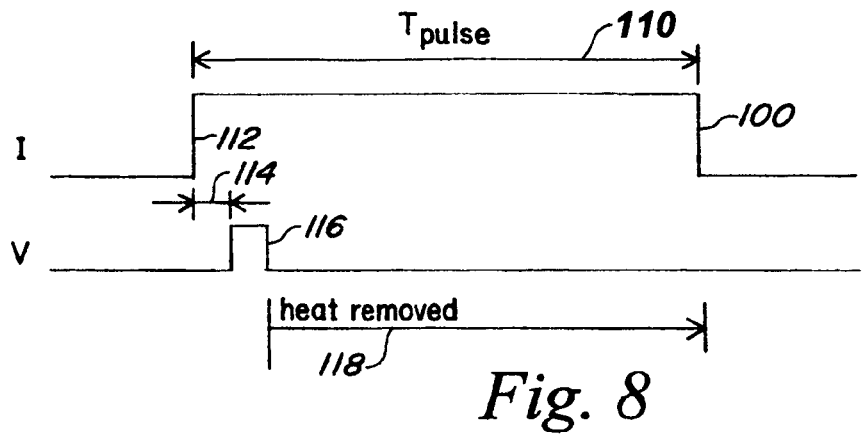
FIG. 8 is a waveform diagram illustrating the current pulse provided to the resistance of layer of FIG. 7, also illustrating the voltage readout as well as the time that heat is removed due to the thermoelectric effect during the particular duty cycle.

Referring to FIG. 8, the current pulse 100 is illustrated as having a pulse length indicated by doubled ended arrow 110, and is typically 50 milliseconds. The voltage is readout at the leading edge of pulse 100 here illustrated as 112 slightly offset from this time by an amount illustrated by an arrow 114. The voltage readout is illustrated at 116, after which heat is removed from the resistive layer through the thermoelectric effect during the length of time illustrated by arrow 118 until the pulse is turned off. Thereafter, the bismuth telluride bridge becomes thermally non-conductive or at least returns to its original low thermal conductivity.

Figure 9:
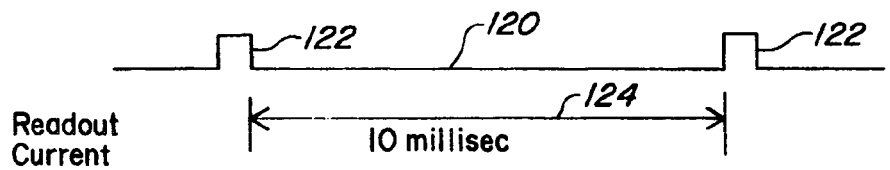
FIG. 9 is a waveform diagram illustrating that within a duty cycle that incorporates the integration time, the readout current is cycled once every 33.3 milliseconds corresponding to a 30 frame-per-second read out frame rate.

Referring now to FIG. 9, assuming a duty cycle for the readout pulses of 10 milliseconds illustrated by wave form 120, then the read out current pulses 122 are separated by an integration interval, in one embodiment at 10 milliseconds as illustrated at 124. This readout interval or integration interval is used for the detector to collect incoming reduction. At this point the thermal coefficient of the support members is meant to be quite low making the support a very poor thermal conductor. This is the case when no current is flowing. The lower the thermal coefficient, the higher the sensitivity.

Figure 10:
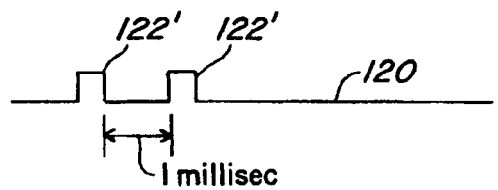
FIG. 10 is a waveform diagram of the duty cycle for a one millisecond integration time which corresponds to a 300 frame-per-second frame rate; and, FIG. 11 is a diagrammatic representation of the fill factor utilizing the serpentine sensor support mechanism of FIG. 1, versus the thermoelectric bridge mechanism of FIG. 7.

Referring to FIG. 10, if one can reduce the inter sample time to 1 millisecond as illustrated by pulses 122', then the frame rate can be as high as 1,000 Hertz.

Figure 11:
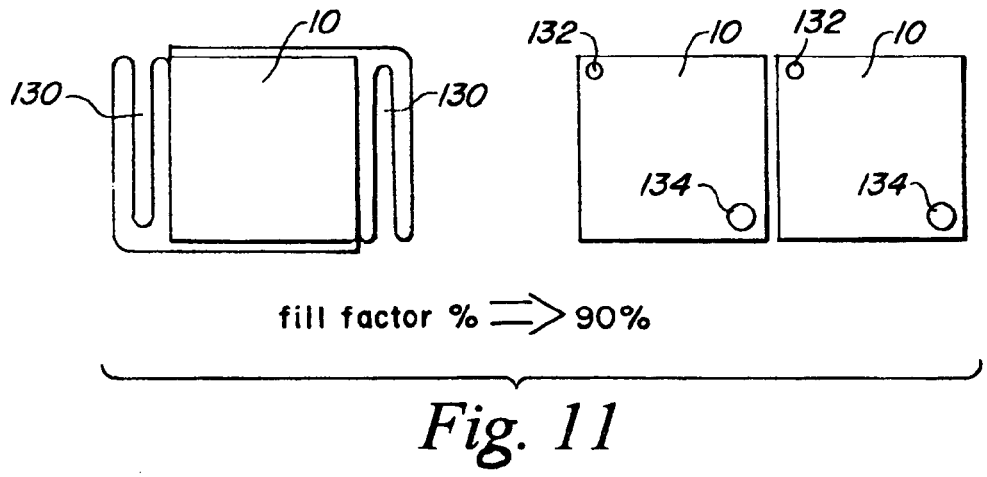

As can be seen from FIG. 11 a detector 10 having the serpentine conductor structure 130 illustrated requires a good deal of space between each of the detectors in order for the serpentine conductors to exist laterally to either side of the detector. However, with the thermoelectric bridge 70 mounting system of FIG. 7, detectors 10 maybe spaced adjacent to each other, with the connections to the detector at 132 and 134 being underneath the detector, thus allowing the detectors themselves to be tightly packed.

The fill factor associated with the mounting system using the serpentine conductors is 60%. When going to the thermoelectric bridge support structure of FIG. 7 the fill factor goes close to 90%.

This being the case the thermoelectric bridge structure for supporting individual detectors in an IR focal plane array results in a both increased sensitivity equivalent to increasing the detection range of the array by a factor of 3, and a dramatic increase in frame rate.

Having now described a few embodiments of the invention, and some modifications and variations thereto, it should be apparent to those skilled in the art that the foregoing is merely illustrative and not limiting, having been presented by the way of example only. Numerous modifications and other embodiments are within the scope of one of ordinary skill in the art and are contemplated as falling within the scope of the invention as limited only by the appended claims and equivalents thereto.

What is claimed is:

1. A method for improving sensitivity of an infrared detector having an array of detectors including supporting legs, comprising the steps of:

using a number of detectors, each including a thermoelectric bridge support having opposite conductivity type legs of semiconductor material to support the associated detector; and, reading out each of the detectors by applying a current pulse through the legs in one direction, with the voltage associated with the leading edge reading out the detector and with the remainder of the pulse resulting in thermoelectric cooling of the legs alter readout, thereby to remove heat from the detector to provide a low NEDT for high sensitivity.

2. A method for decreasing the size of detectors in an infrared detector array, comprising the steps of:

providing the detector of the array with a thermoelectric bridge support for each of the detectors, the bridge support having a pair of legs of opposite conductivity type semiconductor material;

applying a pulsed current waveform that performs a switching function, with the current applied through the thermoelectric bridge legs to initially readout a detector by a voltage associated with a leading edge of a pulse and to subsequently cool the detector such that the same pulsed waveform is used to readout and cool the detector, the thermoelectric bridge located beneath a detector so as to achieve a good fill factor.

3. The method of claim 2, wherein the detector array has elements and wherein the array includes reduced spacing for the elements to decrease in the size of the size of the array as the result of using the thermoelectric bridge below a detector, thus to reduce size, weight and cost of a sensor utilizing the infrared detector array.

* * * * *